(12) United States Patent
Hughes et al.

(10) Patent No.: US 7,891,999 B2
(45) Date of Patent: Feb. 22, 2011

(54) FULLY INSULATED FUSE TEST AND GROUND DEVICE

(75) Inventors: David Charles Hughes, Rubicon, WI (US); Steven Guy Whitmore, South Milwaukee, WI (US)

(73) Assignee: Cooper Technologies Company, Houston, TX (US)

( * ) Notice: Subject to any disclaimer, the term of this patent is extended or adjusted under 35 U.S.C. 154(b) by 0 days.

(21) Appl. No.: 12/701,735

(22) Filed: Feb. 8, 2010

(65) Prior Publication Data

US 2010/0136823 A1    Jun. 3, 2010

Related U.S. Application Data

(63) Continuation of application No. 11/931,240, filed on Oct. 31, 2007, now Pat. No. 7,695,291.

(51) Int. Cl.
    *H01R 13/53*  (2006.01)
(52) U.S. Cl. .................. 439/181; 439/88; 439/187; 439/921
(58) Field of Classification Search .......... 439/181, 439/511, 88, 921, 187
    See application file for complete search history.

(56) References Cited

U.S. PATENT DOCUMENTS

| | | |
|---|---|---|
| 3,392,363 A | 7/1968 | Geis, Jr. et al. |
| 3,471,669 A | 10/1969 | Curtis |
| 3,513,425 A | 5/1970 | Arndt |
| 3,720,904 A | 3/1973 | De Sio |
| 3,753,203 A | 8/1973 | Link |
| 3,915,534 A | 10/1975 | Yonkers |
| 4,103,123 A | 7/1978 | Marquardt, Jr. |
| 4,107,486 A | 8/1978 | Evans |
| 4,161,012 A | 7/1979 | Cunningham |
| 4,443,054 A | 4/1984 | Ezawa et al. |
| 4,946,393 A | 8/1990 | Borgstrom et al. |
| 5,393,240 A | 2/1995 | Makal et al. |
| 6,042,407 A * | 3/2000 | Scull et al. .................. 439/181 |
| 6,332,785 B1 * | 12/2001 | Muench et al. ............... 439/88 |
| 6,338,637 B1 | 1/2002 | Muench, Jr. et al. |
| 6,364,216 B1 * | 4/2002 | Martin ....................... 439/181 |

(Continued)

OTHER PUBLICATIONS

"Loadbreak Apparatus Connectors, 200 A 35 kV Class Three-Phase Loadbreak Injection Elbow Installation Instructions, Service Information S500-55-2"; Cooper Power Systems; pp. 1-6; (Apr. 1999).

*Primary Examiner*—Michael C Zarroli
(74) *Attorney, Agent, or Firm*—King & Spalding LLP

(57) ABSTRACT

A fuse test and ground device includes an insulated housing with a bore that extends from the front of the housing towards the rear of the housing. An electrical contact is disposed partially within the bore. A current interrupter, such as a fuse, is electrically connected between the contact and a testing ground lead. An eye, having it's surface insulated by the housing, can be attached to the housing and provide a connection point for manipulation of the device. A grounding bore extends from a second aperture into the housing and provides an electrical connection to the contact. A grounding plug can be connected to ground on one end and inserted into the grounding bore to create a permanent ground for the device. An annunciator is connected to the current interrupter such that the annunciator provides an indication when a current flows through the current interrupter.

18 Claims, 7 Drawing Sheets

U.S. PATENT DOCUMENTS

| | | | |
|---|---|---|---|
| 6,517,366 B2 * | 2/2003 | Bertini et al. | 439/190 |
| 6,744,255 B1 * | 6/2004 | Steinbrecher et al. | 324/511 |
| 6,864,444 B2 | 3/2005 | Anger et al. | |
| 6,888,086 B2 * | 5/2005 | Daharsh et al. | 218/155 |
| 7,212,389 B2 * | 5/2007 | Hughes | 361/118 |
| 7,258,585 B2 | 8/2007 | Hughes et al. | |
| 7,470,131 B2 | 12/2008 | Hughes | |
| 7,695,291 B2 | 4/2010 | Hughes et al. | |

* cited by examiner

FULLY INSULATED FUSE TEST AND GROUND DEVICE

CROSS-REFERENCE TO RELATED APPLICATIONS

This application is a continuation of U.S. patent application Ser. No. 11/931,240, entitled "Fully Insulated Fuse Test And Ground Device," filed Oct. 31, 2007 now U.S. Pat. No. 7,695,291, the entirety of which is incorporated by reference herein.

FIELD OF THE INVENTION

The present invention relates generally to the field of electric power distribution systems. More particularly, the invention relates to a combined grounding device and testing tool for use in an electric power distribution system.

BACKGROUND OF THE INVENTION

In power distribution systems, high-voltage separable connectors interconnect various forms of electrical equipment, such as transformers, switchgear, distribution cables, and the like. These connectors typically have an elbow component that mates with a bushing component. The electrical equipment often needs to be grounded. For example, the electrical equipment must be grounded for repair or servicing, or when being moved to reconfigure or isolate parts of the system. In these examples, a grounding device (e.g., a grounding elbow) is typically used to provide a visible ground.

Unfortunately, conventional grounding devices, such as grounding elbows without fuses, have drawbacks. These grounding devices do not include an active element that prevents fault close. Therefore, the conventional grounding devices do not include fault close protection, are not able to prevent a fault and thus, are subject to a fault close. If an operator were to mistakenly position the conventional grounding device on an energized bushing a fault close and explosion would occur that can cause serious harm to the operator.

In an attempt to improve on the conventional grounding device an alternative grounding device was developed as set forth in U.S. Pat. No. 6,744,255. However, the alternative grounding device also has drawbacks. The alternative grounding device has attachment eyes, permanent ground leads, and conductive connections that are exposed and not insulated. The exposed portions of this device can generate a "live-front" situation if power is still being applied to the electrical equipment to which the grounding device is attached. In addition, because transformers and switchgears typically include several connectors in close proximity, a live-front situation in one grounding device can lead to an arc-to-ground from the exposed portions of the grounding device to ground through the other connectors of the switchgear or transformer, causing extensive damage.

In view of the foregoing there is a need in the art for a grounding device that can be attached to electrical equipment without having conductive surfaces that remain exposed and not insulated, thereby causing a potential live-front situation. Furthermore, there is a need in the art for a grounding plug that can be inserted into an insulated portion of a grounding device and provide a pathway for permanent grounding of the grounding device when connected to the electrical equipment.

SUMMARY OF THE INVENTION

A fully insulated fuse test and ground device provides improved safety by incorporating the eye, ground lead and conductive connections within an insulated housing. The tool also provides a connection point for permanent ground and corresponding plugs for insertion into the connection point to provide a more secure permanent ground connection for the device.

A grounding and testing device according to the invention may include an electrically insulated housing having a bore that extends from an opening at the front of the housing towards the back of the housing. A portion of an electrical contact for the device may be disposed within the bore of the housing, such that the bore and the contact are designed to be mated with a bushing. A current interrupter, such as a current limiting fuse, can form an electrical connection between the contact and a testing ground lead. An eye, which may include an outer surface covered by the housing, can be connected to a portion of the back of the housing. The device may also include an electrically conductive connection positioned within the housing and attached to the electrical contact and the current interrupter. In addition, an annunciator may be positioned near the current interrupter to provide an indication when current is flowing through the current interrupter.

The device can also include a connection point made up of a grounding bore that extends from a second aperture in the housing towards an interior of the housing. The grounding bore may be horizontally oriented beneath the eye along the back of the housing. The connection point allows for the connection of a grounding plug, which provides a permanent ground connection for the device. The grounding plug can be inserted into the grounding bore and threaded into the electrically conductive connection.

The grounding plug may include a conductive shaft made from metallic materials, such as copper or aluminum, and capable of being inserted into the grounding bore. An operating eye can be attached to one end of the conductive shaft and provide a connection point for a hotstick to generate an axial rotation on the conductive shaft. The opposing end of the conductive shaft may include a threaded tip for connecting the plug to the connection point in the grounding bore. The opposing end of the conductive shaft may instead be coupled to a probe that extends in the axial direction of the conductive shaft and can include a recess extending circumferentially about part of the probe for receiving finger contacts. A conductor, such as a wire, may be attached at one end to ground and along the other end to the conductive shaft or a compression connector, which is electrically connected to the conductive shaft. The grounding plug may also include an access plate placed around the conductive shaft. The grounding plug may further include a toggle lever attached to one end of the conductive shaft, wherein the lever can generate a compression force between a sleeve and the conductive shaft when the lever is placed in a locked position.

BRIEF DESCRIPTION OF THE DRAWINGS

For a more complete understanding of the exemplary embodiments of the present invention and the advantages thereof, reference is now made to the following description in conjunction with the accompanying drawings in which.

DETAILED DESCRIPTION OF THE EXEMPLARY EMBODIMENTS

The present invention is directed to a fully insulated fuse test and ground device. The present invention is also directed to a grounding plug that may be used in conjunction with the fully insulated fuse test and ground device to provide a permanent ground to the device. The present invention is also directed to methods of providing a permanent ground to a fully insulated fuse test and ground device through the use of a grounding plug. Exemplary embodiments of the invention can be more readily understood by reference to the accompanying figures.

Exemplary embodiments of the present invention include a fully insulated fuse test and ground device and a grounding plug used in conjunction therewith to provide a permanent ground to the device when used in a power distribution environment. However, it should be apparent that there could be many different ways of implementing the invention in a power distribution environment, and the invention should not be construed as limited to a high voltage environment or any one set of features or methods described herein. The inventive functionality of the fully insulated fuse test and ground device and grounding plugs will be explained in more detail in the following description and is disclosed in conjunction with the remaining figures.

Figure 1:
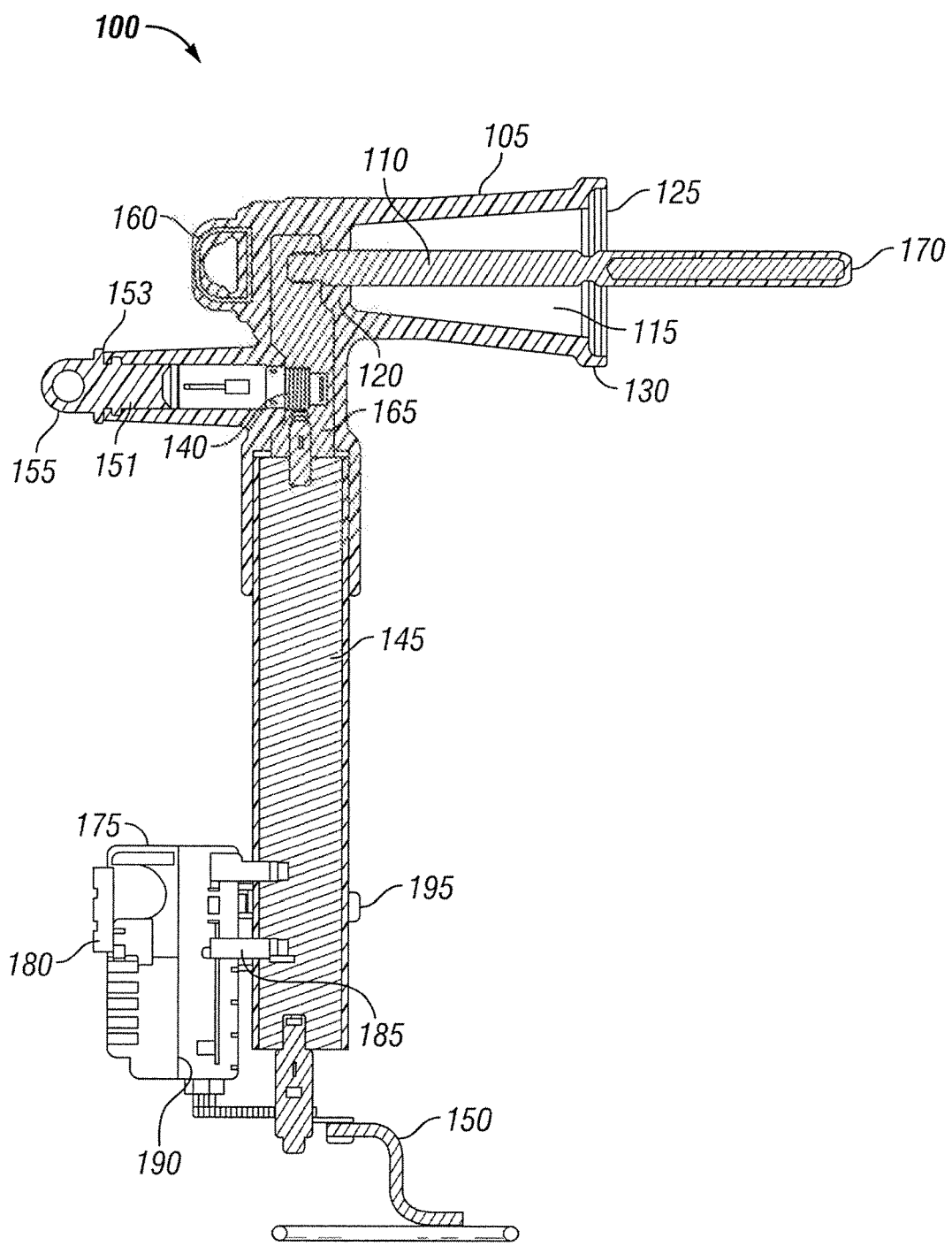
FIG. 1 is a cross sectional view of a fully insulated grounding and testing device for power distribution systems, in accordance with certain exemplary embodiments of the present invention.

Referring now to the drawings in which like numerals represent like elements throughout the several figures, aspects of the present invention will be described. FIG. 1, shows a cross-sectional view of a grounding and testing device 100 for power distribution systems according to certain exemplary embodiments of the present invention. Referring to FIG. 1, the grounding and testing device 100 includes an electrically resistive, or insulating, housing 105, sometimes referred to as a rubber insulated housing. The housing 105 may be constructed from a material such as EPDM (ethylene-propylene-dienemonomer) rubber; however, other suitable insulating materials may used in place of the EPDM. A horizontally-oriented bore 115 within the housing 105 extends from an aperture 125 at a front 130 of the housing 105 towards the rear 120 of the housing 105.

An electrical contact or probe 110 (hereinafter "probe"), such as an electrically conductive rod, is disposed at least partially within the bore 115. The bore 115, aperture 125, and probe 110 are generally adapted to mate with a bushing of a power distribution system (not shown). For example, the device 100 may be mated with a two hundred amp interface as defined by IEEE Std 386-1995. To this end, the probe 110 is aligned along the axis of the bore 115, which has a generally conical shape, with an annular locking ring (not shown) formed near the rear 120 of the housing 105.

A current interrupter 145 is electrically connected between the probe 110 and a testing ground lead 150. The current interrupter 145 can be a fuse, recloser, breaker, or other suitable device. For example, the current interrupter 145 may be a current-limiting fuse constructed from a tube of sand having a silver element coiled within the sand. If too much current is transmitted through the silver element, the element will melt, thereby melting the surrounding sand and transforming the sand into fulgurite, which is a good insulator and prevents the current from passing through the current interrupter 145.

In certain exemplary embodiments, the current interrupter 145 is attached to the probe 110 substantially perpendicular to the probe 110 through an electrically conductive connector 165. The electrically conductive connector 165 is typically positioned within the housing 105 and connected to a portion of the probe 110 that extends through the rear 120 of bore 115. In certain exemplary embodiments, the electrically conductive connector 165 is made of copper or aluminum; however, other suitable conductive materials may also be used. The current interrupter 145 is electrically connected between the probe 110 and the testing ground lead 150 by having a first lead attached to the connector 165 and a second lead connected to the testing ground lead 150.

The device 100 also includes a grounding bore 151 positioned within the housing 105. The grounding bore 151 can extend from an aperture 153 along the back of the housing towards the electrically conductive connector 165. In certain exemplary embodiments, the grounding bore can be horizontally-oriented or vertically oriented (not shown). Furthermore, the grounding bore 151 may be positioned below an eye 160 along the back of the housing 105.

A threaded channel 140 may be disposed within the grounding bore 151. The threaded channel 140 is designed to receive at least a portion of a grounding plug (not shown) which can include a threaded tip. The threaded channel 140 can include a generally cylindrical outer layer made of electrically conductive material, such as copper, and is electrically connected to the probe 110 by way of the electrically conductive connector 165. In certain exemplary embodiments, the threaded channel 140 is attached to the probe 110 substantially parallel to the length of the probe 110 by way of the electrically conductive connector 165. The threaded channel 140 provides an electrical path between a grounding plug and the probe 110 through the electrically conductive connector 165.

When threaded channel 140 is not in use, the aperture 153 of the grounding bore 151 may be covered with an insulating plug 155. The insulating plug 155 can be constructed of a non-conductive material, such as plastic. The insulating plug 155 can be designed to snap into the aperture 153 or the plug 155 may include a threaded rod (not shown) that may be inserted into the grounding bore 151 and threadably coupled to the threaded channel 140.

An annunciator 175 may be positioned proximate to the current interrupter 145 such that the annunciator 175 provides an indication when a current flows through the current interrupter 145. For example, the annunciator 175 may provide an indication of current flow through the use of a magnetic reed switch 185 and a horn 180. As shown in FIG. 1, the annunciator 175 may be held in position about the current interrupter 145 with a strap 195 or other suitable mounting device. When current flows through the current interrupter 145 and the testing ground lead 150, a magnetic field is created. The placement of the magnetic reed switch 185 in the annunciator 175 is such that the magnetic field caused by the current flow causes the magnetic reed switch 185 to close. The closing of the magnetic reed switch 185 connects the horn 180 to a power source 190, which causes the horn 180 to produce a sound. Other circuitry (not shown) keeps the magnetic reed switch 185 closed when the current interrupter 145 interrupts the current and the magnetic field dissipates. Keeping the magnetic reed switch 185 closed results in the horn continuing to sound until the annunciator 175 is reset.

The current interrupter 145 is designed to control the effects of an inadvertent fault close to a level that will not damage equipment, regardless of the source of fault current (e.g., an inadvertently energized bushing or a capacitively coupled voltage). For example, using a current limiting fuse as current interrupter 145, a current limiting fuse with a maximum interrupting current of 50 kA would suffice to keep the effects at a safe level for a 600 amp connection with a 200 amp loadbreak reducing tap plug.

The eye 160 can be positioned along the rear of the housing 105. The surface area of the eye 160 is generally enclosed within the housing 105. In certain exemplary embodiments, the eye 160 is in electrical connection with the probe 110 and may be directly coupled to the probe 110. The eye 160 includes an aperture that provides a point of connection with a hotstick for manipulation of device 100. The eye 160 is typically made of copper or another conductive material and is surrounded along its periphery by the housing 105 to limit live-front situations when current is passing through the probe 110. The eye 160 can be connected to the end of the probe 110 by a torque limiting head (not shown). The eye 160 and the probe 110 may be connected to each other in a manner similar to that described in U.S. Pat. No. 5,230,142, which is incorporated herein by reference. A tip 170 of the probe 110 is designed to mate with an internal nut of a loadbreak reducing tap plug. The probe 110 can be connected to the connector 165 in a manner that allows the probe 110 to rotate without rotating the connector 165.

Figure 2:
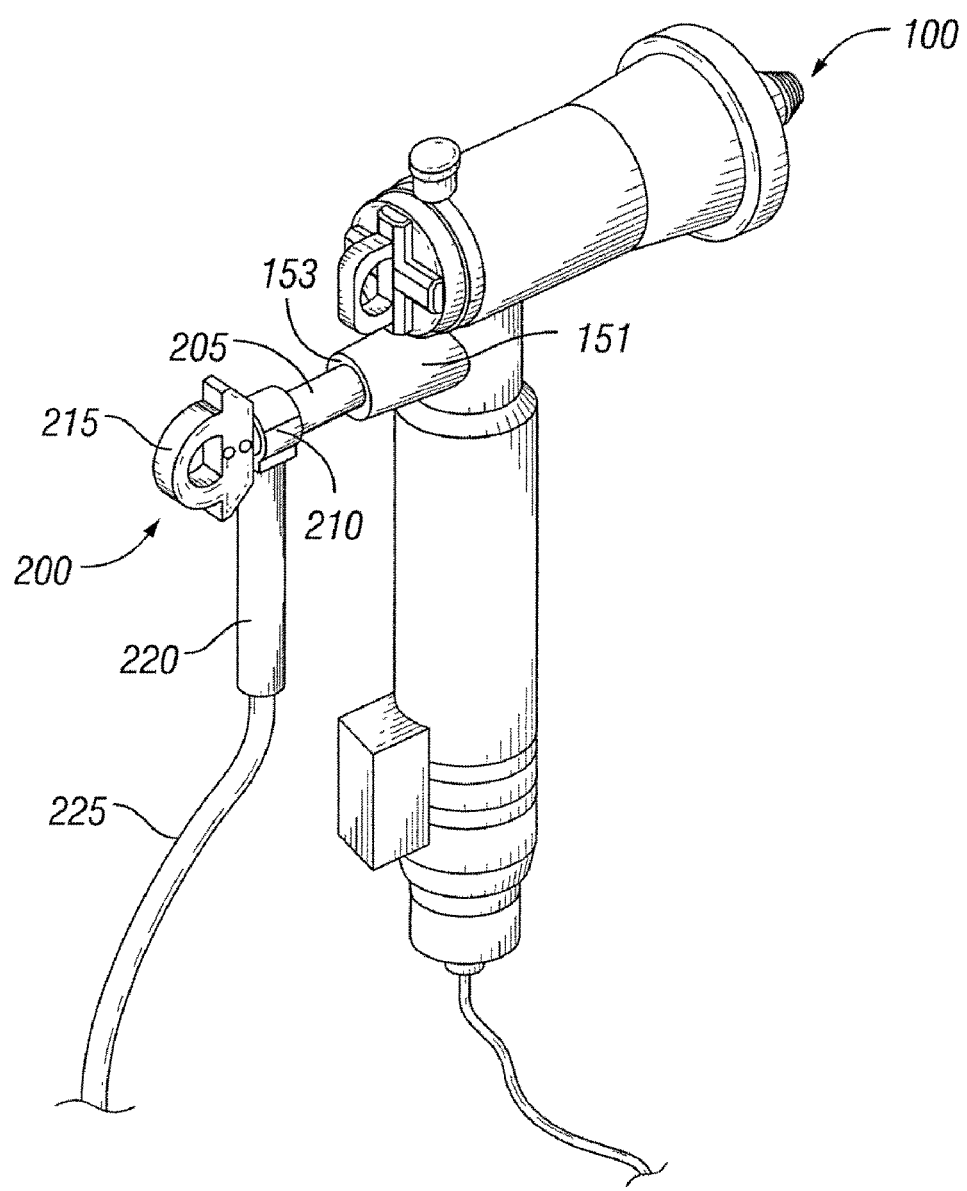
FIG. 2 is a perspective view of the grounding and testing device of FIG. 1 as it is receiving a grounding plug, in accordance with certain exemplary embodiments of the present invention.

FIG. 2 is a perspective view of the device 100 shown as it is receiving a grounding plug 200 in accordance with certain exemplary embodiments of the present invention. Referring to FIGS. 1 and 2, the grounding plug 200 includes a conductive shaft 205. The conductive shaft 205 may have an elongated cylindrical shape and is designed such that the conductive shaft 205 may be slidably inserted into grounding bore 151 of the device 100 through the aperture 153. The conductive shaft 205 can also include a threaded portion (not shown) along the tip of the leading edge of the conductive shaft 205 that is inserted into the bore 151. The threaded portion of the conductive shaft 205 may be coupled to the threaded channel 140. In certain exemplary embodiments, the conductive shaft 205 may be constructed of a metallic material, such as copper or aluminum; however, other suitable conductive materials may also be used.

The exemplary grounding plug 200 also includes an operating eye 215 attached to one end of the conductive shaft 205. The operating eye 215 can include a threaded member (not shown) capable of being coupled to a thread receiving portion positioned along the end of the conductive shaft 205 (not shown). The operating eye 215 typically includes a channel extending through the operating eye 215 in a direction substantially perpendicular to the conductive shaft 205. The operating eye 215 is designed to be grasped and manipulated by a hotstick. For example, a lineman can grasp the grounding plug 200 through the operating eye 215 with the hotstick, place the conductive shaft 205 into the grounding bore 151, and rotate the operating eye 215 (through a corresponding rotation of the hotstick) to secure the threaded portion of the conductive shaft 205 into the threaded channel 140. In certain exemplary embodiments, the operating eye 215 may be constructed of a metallic material, such as copper; however, other suitable conductive materials may also be used.

A sleeve 210 may be positioned proximate to the operating eye 215. The sleeve 210 has a generally cylindrical shape with a horizontally-oriented channel. The channel of the sleeve 210 is designed such that the conductive shaft 205 can be inserted into and through the sleeve 210, when the conductive shaft 205 and the operating eye 215 are attached to one another. A cable connector 220 can be attached to one exterior side of the sleeve 210. The cable connector 220 can have an elongated cylindrical shape with a channel provided therein and is designed to have a grounding cable 225, such as a cable, inserted into that channel. The cable connector 220 can be made of a conductive material, such as cooper or aluminum, or other suitable materials. In certain exemplary embodiments, the cable connector 220 is a compression connector. The grounding plug 200 also includes a grounding cable 225, which is attached at one end to the cable connector 220 and at the other end to ground.

Figure 3:
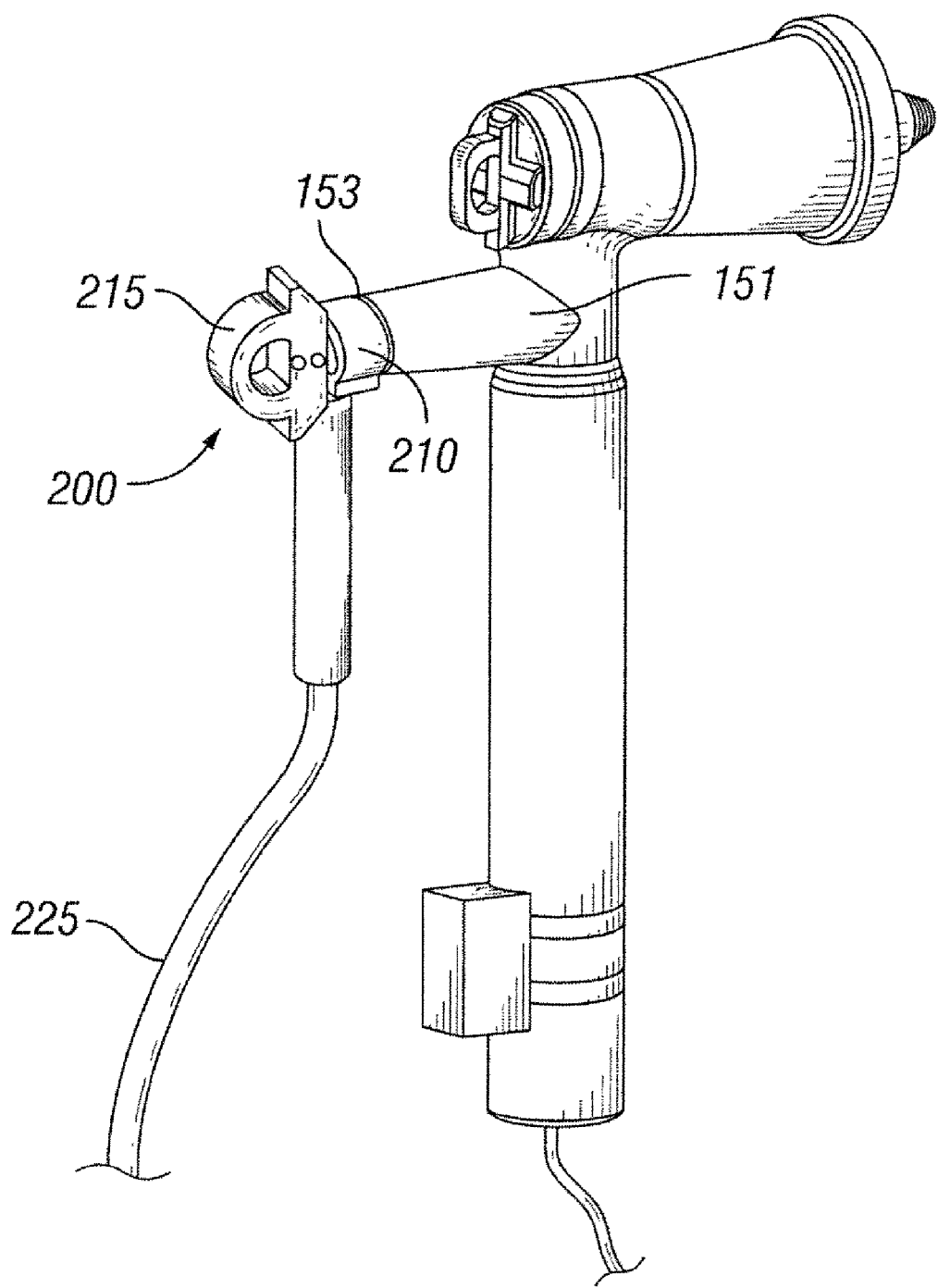
FIG. 3 is another perspective view of the grounding and testing device of FIG. 1 with the grounding plug fully inserted therein, in accordance with certain exemplary embodiments of the present invention.

FIG. 3 presents another perspective view of the device 100 with the grounding plug 200 fully inserted into the grounding bore 151. Referring to FIGS. 1, 2, and 3, when the grounding plug 200 is attached to the threaded channel 140, the conductive shaft 205 is enclosed within the grounding bore 151 and the sleeve 210. The sleeve 210 is positioned proximate to and may abut the grounding bore 151 near the aperture 153. The operating eye 215 may be rotated with a hotstick until the grounding plug 200 is securely fastened to the threaded channel 140 in the device 100. During a typical operation, the grounding cable 225 will be attached to ground prior to the conductive shaft 205 being inserted into the grounding bore 151.

Figure 4:
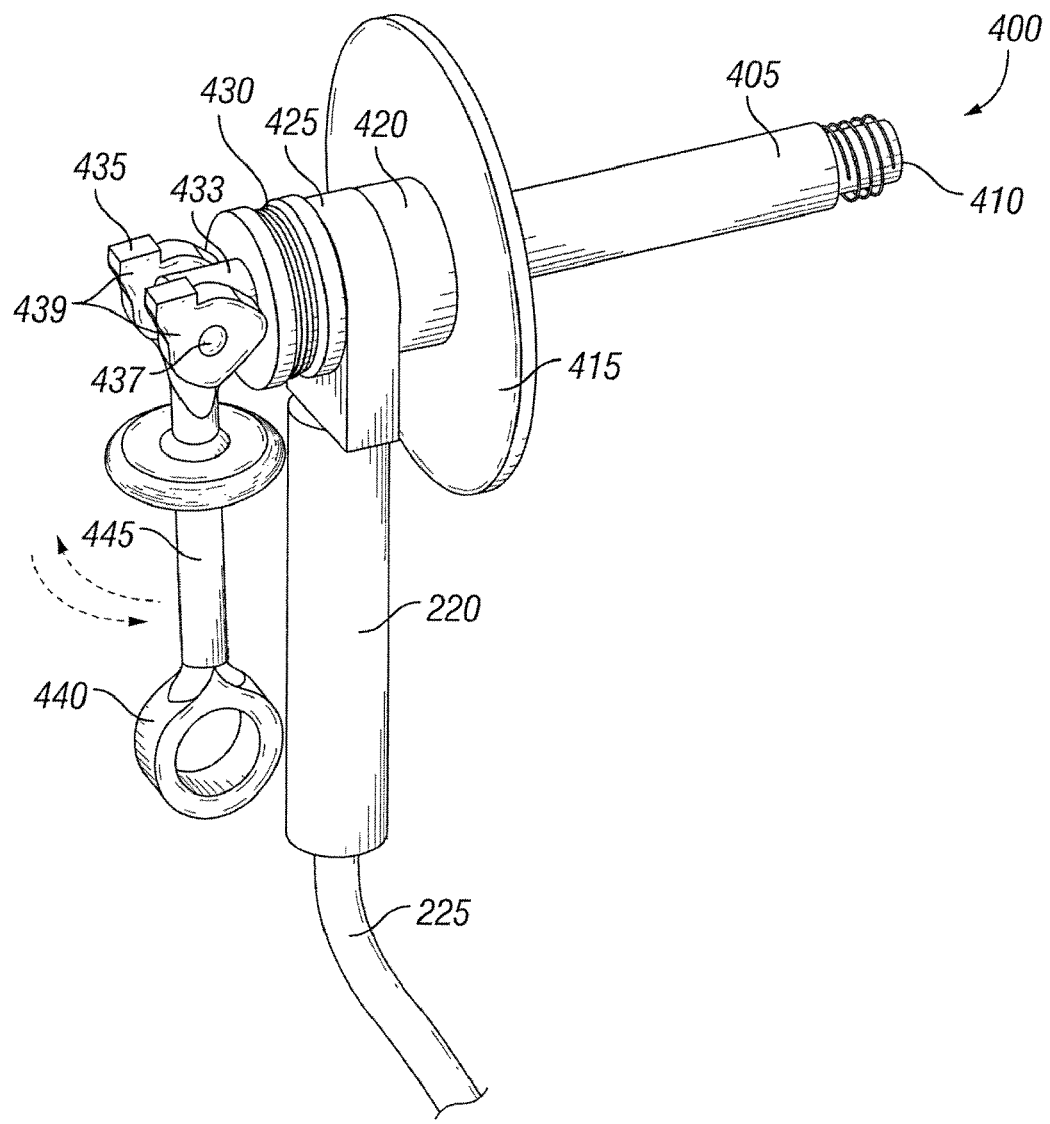
FIG. 4 is a perspective view of an alternative grounding plug having a toggle lever, in accordance with certain exemplary embodiments of the present invention.

FIG. 4 is a perspective view of an alternative grounding plug 400 having a toggle lever 435 in accordance with certain exemplary embodiments of the present invention. Referring now to FIGS. 1 and 4, the grounding plug 400 includes a conductive shaft 405. The conductive shaft 405 can have a cylindrical shape and is designed to be slidably inserted into the grounding bore 151 of the device 100 through the aperture 153. The conductive shaft 405 can also include a threaded tip 410 along the end of the conductive shaft 405 that is inserted into the bore 151. The threaded tip 410 can be coupled to the threaded channel 140 of the device 100. The conductive shaft 405 can also include a second threaded tip (not shown) along the other end of the conductive shaft 405. The second threaded tip can be attached to a thread receiving portion of the toggle lever 435. In certain exemplary embodiments, the conductive shaft 405 may be constructed of a metallic material, such as copper; however, other conductive materials may also be used.

The exemplary plug 400 can also include a sleeve 425 positioned proximate to the lever 435. The sleeve 425 may have any number of shapes and generally includes a hollow channel (not shown) bored therein along the axis of the conductive shaft 405. The channel of the sleeve 425 is generally designed so that the conductive shaft 405 may be slidably positioned through the channel. In certain exemplary embodiments, the channel is horizontally-oriented through the sleeve 425.

The plug 400 may also include an access plate 415 positioned around the periphery of the conductive shaft 405. The access plate 415 may be generally described as a disc having a channel (not shown) extending substantially through the center of the access plate 415. The channel of the access plate 415 is designed to have a diameter such that the conductive shaft 405 may fit therein. The access plate 415 generally extends outward from the periphery of the conductive shaft 405 in a direction that is substantially perpendicular to the axis of the conductive shaft 405. In certain exemplary embodiments, the access plate 415 extends outward from the conductive shaft, such that when the plug 400 is coupled to the threaded channel 140, the access plate 415 will prevent a lineman from using a hotstick to grasp the eye 160 and insert the device 100 into a bushing. In addition, the access plate 415 is designed to divert an explosive blast which may be caused when an operator does not follow proper procedures and the conductive shaft 405 is connected to the threaded channel 140 while the system is still live.

The grounding plug 400 may also include a spacer block 420 positioned between the sleeve 425 and the access plate 415. The spacer block 420 typically includes a channel extending through the block 420. The channel of the spacer block 420 can be in-line with the channels of the access plate 415 and sleeve 425. The channel of the spacer block 420 is generally designed so that the conductive shaft 405 may be slidably positioned through the channel. The grounding plug 400 can also include beveled springs or washers 430. The beveled springs or washers 430 include an aperture or channel (not shown) that is in-line with the channels of the sleeve 425, spacer block 420, and access plate 415. The beveled springs or washers 430 are designed to apply a force against the sleeve 425 along the axis of the conductive shaft 405.

The end of the conductive shaft 405 opposite the threaded tip 410 can be attached to a toggle lever 435. For example, the toggle lever 435 can include a thread receiving portion that can be attached to a second threaded tip of the conductive shaft 405. Alternatively, the conductive shaft 405 may be attached to the toggle lever 435 using other suitable attachment methods, including, but not limited to, welding. The toggle lever 435 includes an attachment base 433, a shaft 437 extending through the base 433, one or more cams 439 coupled to the shaft 437 and capable of rotation about the shaft 437, a lever arm 445 having a first end and a second end, the first end of the lever arm 445 capable of being attached to the cams 439 and the second end of the lever arm 445 capable of being attached to an operating eye 440.

The operating eye 440 typically includes a channel extending through the operating eye 440. The operating eye 440 is designed to be grasped and manipulated by a hotstick as described above. In certain exemplary embodiments, the operating eye 440, lever 445, cams 439, shaft 437, and/or base 433 may be constructed of a metallic material, such as copper; however, other suitable conductive and non-conductive materials may also be used.

The toggle lever 435 is designed to be adjusted between a locked and unlocked position by rotation of the lever 445 and operating eye 440 about the shaft 437, wherein the rotation causes the cams 439 to apply differing levels of pressure against base 433 and beveled springs or washers 430. In certain exemplary embodiments, the unlock position is achieved when the lever 445 is parallel with the axis of the conductive shaft 405. In the unlocked position, the operating eye 440 may be rotated about the axis of the conductive shaft 405 causing a corresponding rotation in the conductive shaft 405 to tighten or loosen the threaded tip 410 in the threaded channel 140 without wrapping the grounding cable 225 about the lever 445. Once the conductive shaft 405 is attached to the threaded channel 140, the lever 445 can be rotated about the shaft 437. The cams 439 create a pulling force on the conductive shaft 405 towards the base 433 and simultaneously create an opposing force on the beveled springs or washers 430, generating an increased compression force between the conductive shaft 405, the sleeve 425, and the components positioned therebetween to create a tight connection between the grounding plug 400 and the grounding bore 151 of the grounding and testing device 100.

A cable connector 220 can be attached along one edge of the sleeve 425. The cable connector 220 can have an elongated cylindrical shape with a channel provided therein and is designed to have a grounding cable 225 inserted into the channel of the cable connector 220. The cable connector 220 can be made of a conductive material, such as cooper or aluminum, or other suitable materials. In certain exemplary embodiments, the cable connector 220 is a compression connector. The grounding plug 400 also includes a grounding cable 225, which is attached at one end to the cable connector 220 and at the other end to ground.

Figure 5:
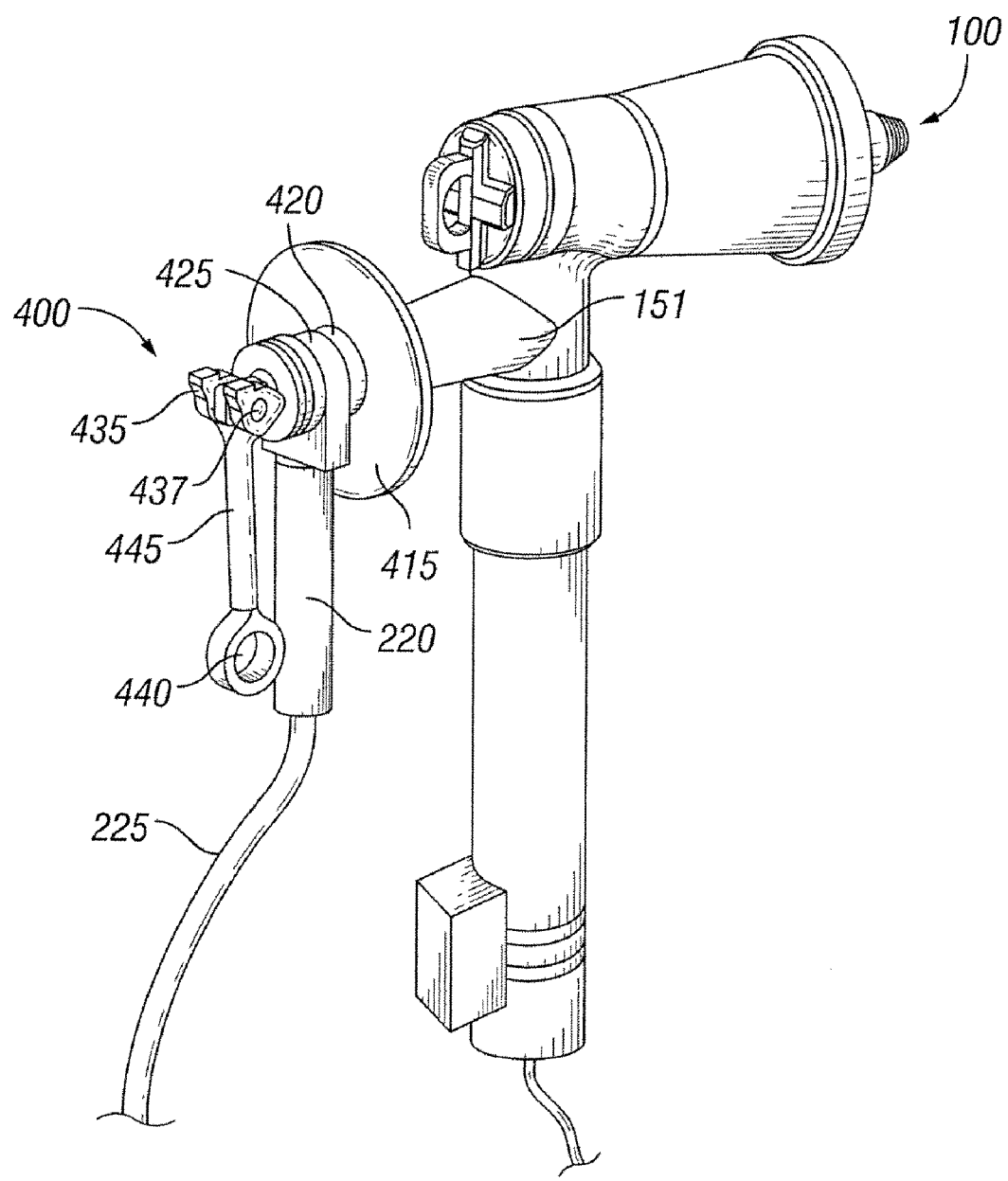
FIG. 5 is a perspective view of the grounding and testing device of FIG. 1 receiving the grounding plug of FIG. 4, in accordance with certain exemplary embodiments of the present invention.

FIG. 5 is a perspective view of the device 100 receiving the alternative grounding plug 400 in accordance with certain exemplary embodiments of the present invention. Now referring to FIGS. 1, 4, and 5, when the grounding plug 400 is attached to the threaded channel 140, the conductive shaft 405 is enclosed within the grounding bore 151, access plate 415, spacer block 420, and sleeve 425. During a typical operation, the grounding cable 225 will be attached to ground prior to the conductive shaft 405 being inserted into the grounding bore 151. The conductive shaft 405 is inserted into the grounding bore 151 through the aperture 153 until the access plate 415 is positioned proximate to the grounding bore 151. When the toggle lever 435 is in the unlocked position, the operating eye 440 may be axially rotated with a hotstick, causing a corresponding axial rotation in the conductive shaft 405 until the conductive shaft 405 is securely fastened to the threaded channel 140 in the device 100. The toggle lever 435 can then be rotated into the locked position by rotating the lever 445 about the longitudinal axis of the shaft 437, thereby increasing the compression force between the conductive shaft 405 and the sleeve 425.

Figure 6:
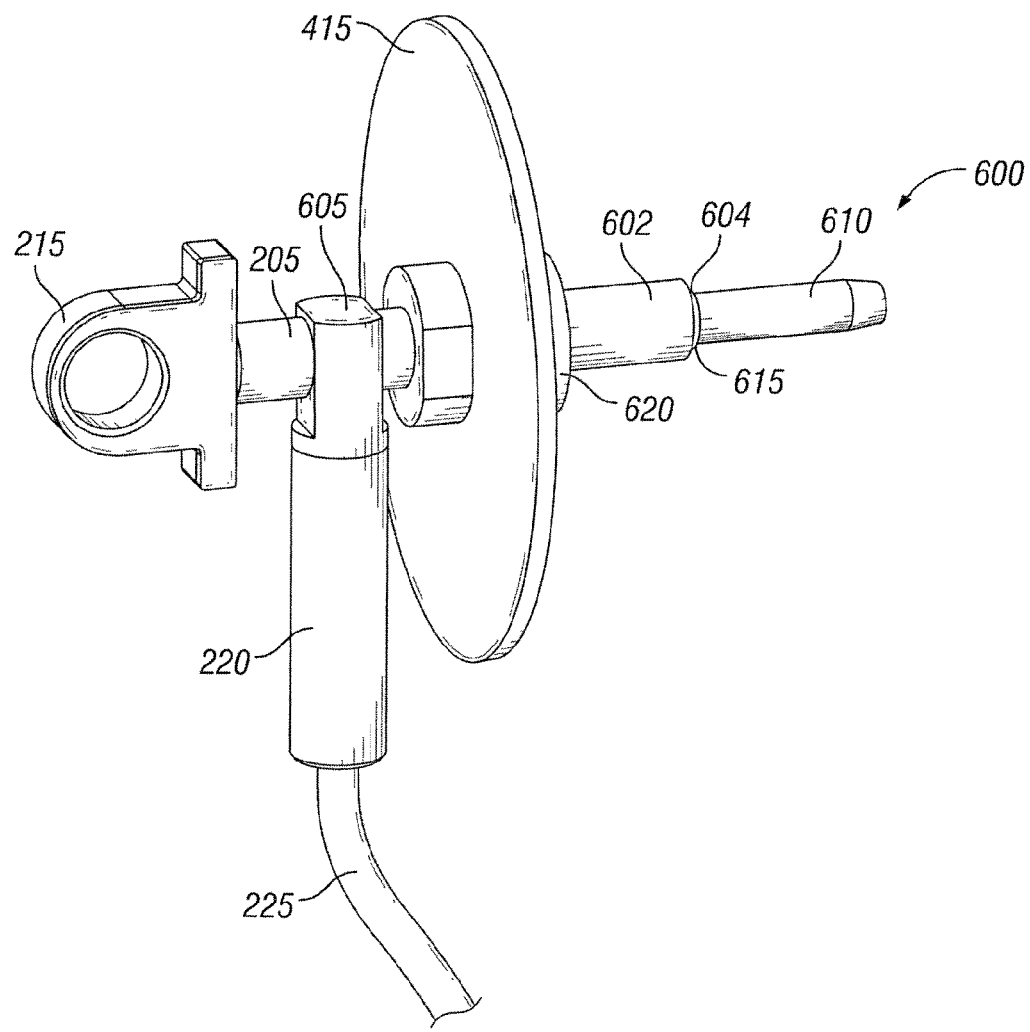
FIG. 6 is a perspective view of an alternative grounding plug having a push-lock probe, in accordance with certain exemplary embodiments of the present invention.

FIG. 6 is a perspective view of another alternative grounding plug 600 having a push-lock probe in accordance with certain exemplary embodiments of the present invention. Referring to FIGS. 1 and 6, the grounding plug 600 includes a conductive shaft 602 having a first end and a second end. The conductive shaft 602 can have a cylindrical shape and is designed to be slidably inserted into grounding bore 151 of the device 100 through the aperture 153. The conductive shaft 602 can be attached along the first end to a push-lock probe 610 and along the second end to an operating eye 215.

In certain exemplary embodiments, the first end of the conductive shaft 602 can include a thread receiving portion 604 and the push-lock probe 610 can include a threaded portion that can be coupled into the thread receiving portion 604 of the conductive shaft 602. The conductive shaft 602 can also include a second threaded tip (not shown) along the second end of the conductive shaft 602 for attaching to a thread receiving portion of the operating eye 215. Alternatively, other suitable attachment methods may be used to attach the conductive shaft 602 to the push-lock probe 610 and the operating eye 215.

In one example, the push-lock probe 610 has a substantially cylindrical shape and an axis in-line with the axis of the conductive shaft 602. Furthermore, the probe 610 can have a smaller diameter than the diameter of the conductive shaft 602. The probe 610 can also include a recess 615 extending around the circumference of a portion of the push-lock probe 610 and presenting an outer surface having a diameter that is smaller than the diameter of the probe 610. In certain exemplary embodiments, the conductive shaft 602, probe 610 and operating eye 215 may be constructed of a metallic material, such as copper; however, other conductive materials may also be used.

The plug 600 may also include an access plate 415 positioned around the periphery of the conductive shaft 602 and generally having the attributes as described in FIG. 4 above. The plug 600 may also include a disc 620 positioned around the periphery of the conductive shaft 602. The disc 620 may be generally described as a plate having a channel (not shown) extending substantially through the center of the disc 620. The channel is designed to have a diameter such that the conductive shaft 602 may fit therein. The disc 620 generally extends outward from the periphery of the conductive shaft 602 in a direction that is substantially perpendicular to the axis of the conductive shaft 602. For example, the disc 620 can extend outward from the conductive shaft 602, such that when the plug 600 is attached to a device 700 similar to that shown and described in FIG. 7, the disc 620 will generate an interference fit with the a portion of the grounding bore 151. The interference fit can assist in maintaining the connection between the plug 600 and the device 700.

The plug 600 also includes a sleeve 605 generally having the features and capabilities described herein with regards to the sleeves (210, 425) of FIGS. 2 and 4. The plug 600 also includes a cable connector 220 attached along one end to the sleeve 605 and attached along the opposing end to a grounding cable 225. Both the cable connector 220 and the grounding cable 225 generally have the features and capabilities described herein with regards to FIGS. 2 and 4.

Figure 7:
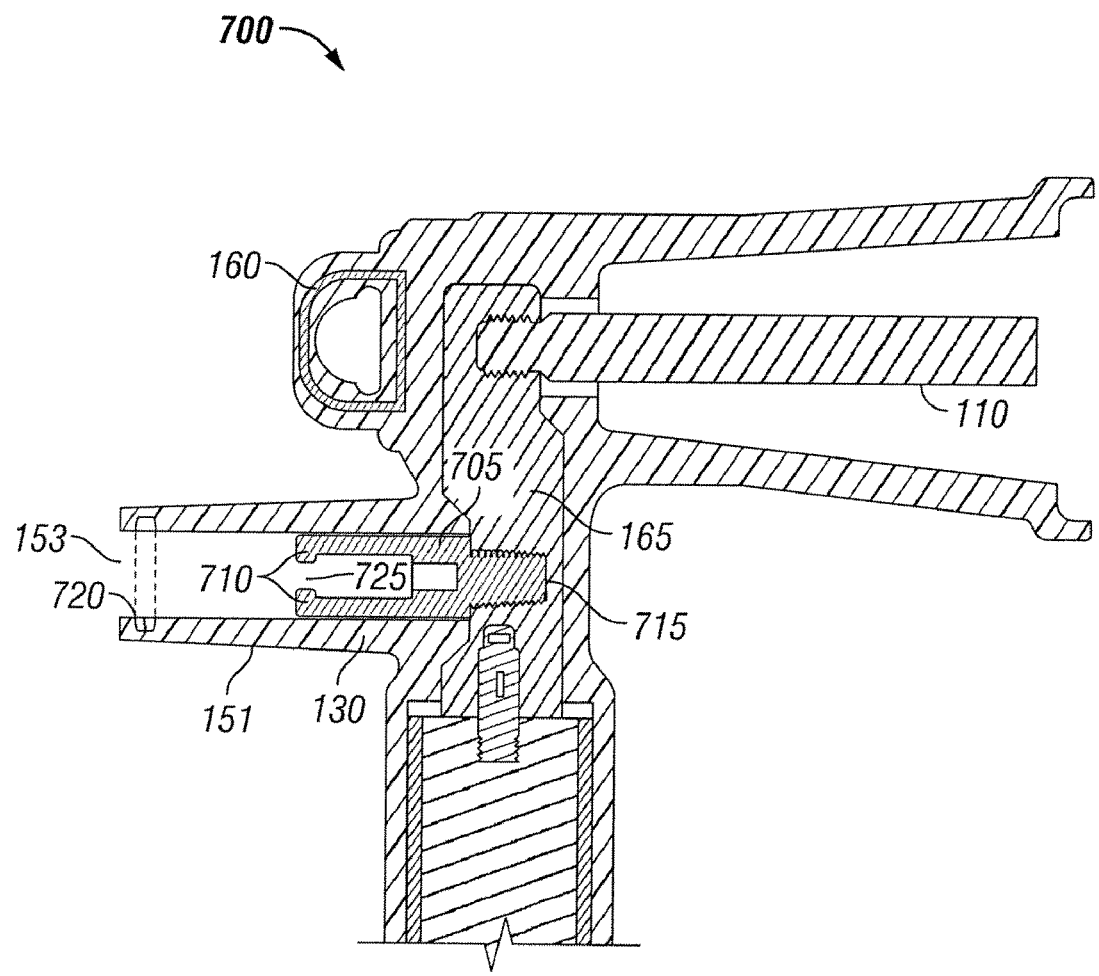
FIG. 7 is a perspective view of an alternative fully insulated grounding and testing device with finger contacts for receiving a push-lock probe, in accordance with certain exemplary embodiments of the present invention.

FIG. 7 is a perspective view of an alternative fully insulated grounding and testing device 700 with finger contacts 710 for receiving the push-lock probe 610 of the grounding plug 600 of FIG. 6. Referring to FIGS. 6 and 7, the alternative device 700 generally includes many of the same exemplary components as the device 100 of FIG. 1, the recitation of which will not be repeated. A finger contact member 705 can be disposed within the grounding bore 151 of the housing 105. The finger contact member 705 can include one end having a threaded portion 715 attached to the conductive connector 165. The other end of the finger contact member 705 can include one or more finger contacts 710. The finger contacts 710 may be positioned about the inner circumference of the grounding bore 151 and form a channel 725 between the ends of the finger contacts 710. The channel 725 is designed to receive the push-lock probe 610 of the grounding plug 600. The grounding bore 151 may also include a recess 720 for receiving and providing an interference fit upon the disc 620 portion of the plug 600 of FIG. 6 while allowing the remaining portion of the grounding bore 151 to maintain an interference fit with the conductive shaft 602 of FIG. 6. The recess 720 can extend circumferentially along the inner surface of the grounding bore 151 predominantly within the housing 105.

During a typical operation, the grounding cable 225 will initially be attached to ground. The probe 610 and the conductive shaft 602 of the grounding plug 600 can be inserted into the grounding bore 151 through the aperture 153. The probe 610 is inserted through the channel 725 until the ends of all or a portion of the finger contacts 710 are positioned within the recess 615 of the probe 610 and the disc 620 is inserted into the grounding bore 151 and makes an interference fit with the recess 720 of the grounding bore 151. In certain exemplary embodiments, the combination of the force applied by the finger contacts 710 along the recess 615 and the force created by the interference fit upon the disc 620 is designed to hold the plug 600 in electrical contact with the device 700.

In conclusion, the present invention is directed to a grounding and testing device that does not include any exposed conductive surfaces, thereby reducing the potential for a live-front situation. In addition, the present invention is directed to a grounding plug that can be inserted into an insulated portion of a grounding and testing device. The grounding plug provides a pathway for permanent grounding of the grounding and testing device when the device is connected to electrical equipment. The foregoing description relates to certain exemplary embodiments of the present invention; it will be evident to those of ordinary skill in the art that various modifications and changes may be made thereto without departing from the spirit and the scope of the present invention as set forth in the appended claims and equivalents thereof. Many aspects of the invention were described herein by way of example only and are not intended to be required or essential elements of the invention unless explicitly so stated.

What is claimed is:

1. A test and ground device for power distribution systems comprising:
    an electrically insulated housing with a bore that extends from an aperture at a front of the housing towards a rear of the housing;
    an electrical contact disposed at least partially within the bore;
    a current interrupter electrically connected between the electrical contact and a ground lead; and
    a connection point positioned within the housing for a ground connection, wherein the connection point comprises a grounding bore extending from a second aperture in the housing towards an interior of the housing and capable of receiving the ground connection, wherein the grounding bore provides a point of electrical connection to the electrical contact,
    wherein the ground connection is a grounding plug comprising:
        a conductive shaft comprising a first end and a second end, said first end capable of being positioned through the second aperture and within the grounding bore of the connection point;
        an operating eye electrically coupled to the second end of the conductive shaft; and
        a grounding cable having a first end and a second end, said first end of the grounding cable being electrically connected to the conductive shaft and said second end capable of being connected to an electrical ground.

2. The device of claim 1, further comprising an eye connected to a portion of the housing and proximate to the rear of the housing, the eye comprising an outer surface, wherein the outer surface of the eye is covered by the housing.

3. The device of claim 1, further comprising an electrically conductive connection disposed within the housing and coupled to the electrical contact and the current interrupter.

4. The device of claim 1, wherein the first end of the grounding plug further comprises a threaded tip, wherein rotation of the operating eye generates a corresponding rotation of the conductive shaft for coupling the threaded tip to the connection point.

5. The device of claim 1, wherein the grounding plug further comprises a compression connection coupled to the grounding cable and electrically connected to the conductive shaft.

6. The device of claim 1, further comprising:
a probe coupled to the first end of the conductive shaft and extending along a longitudinal axis of the conductive shaft, wherein the probe comprises a recess extending circumferentially around a portion of the probe; and
a plurality of finger contacts disposed within the grounding bore and electrically connected to the contact, wherein at least a portion of the finger contacts are received in the recess of the probe when the conductive shaft and the probe of the grounding plug are inserted into the grounding bore.

7. The device of claim 6, further comprising:
a disc positioned about a portion of the conductive shaft and having a diameter larger that the conductive shaft; and
a recess extending circumferentially around a portion of an inner surface of the grounding bore, wherein the disc is received in the recess of the grounding bore and creates an interference fit with the inner surface when the conductive shaft and the probe of the grounding plug are inserted into the grounding bore.

8. The device of claim 1, wherein the grounding plug further comprises a toggle lever coupled to the operating eye and the conductive shaft, wherein the toggle lever is rotatably maneuverable between a locked and an unlocked position, wherein the operating eye and conductive shaft are capable of axial rotation when the toggle lever is in the unlocked position, and wherein the toggle lever generates an increased compression force between a mounting sleeve and the conductive shaft when the toggle lever is in the locked position.

9. The device of claim 1, further comprising an annunciator proximate to the current interrupter, wherein the annunciator provides an indication when a current flows through the current interrupter.

10. The device of claim 1, wherein the current interrupter is a current limiting fuse.

11. A test and ground device for power distribution systems comprising:
an electrically insulated housing with a bore that extends from an aperture at a front of the housing towards a rear of the housing;
an electrical contact disposed at least partially within the bore;
a current interrupter electrically connected between the contact and a testing ground lead;
an electrically conductive connection disposed within the housing and coupled to the electrical contact and the current interrupter;
a grounding bore extending from a second aperture in the housing towards an interior of the housing and capable of receiving a permanent ground connection, wherein the grounding bore provides a point of electrical connection to the electrical contact; and
a plurality of finger contacts disposed within the grounding bore and electrically connected to the electrical contact.

12. The device of claim 11, wherein the grounding bore provides a point of electrical contact to the electrically conductive connection.

13. The device of claim 11, further comprising an annunciator proximate to the current interrupter, wherein the annunciator provides an indication when a current flows through the current interrupter.

14. The device of claim 11, further comprising an eye connected to a portion of the housing and proximate to the rear of the housing, the eye comprising an outer surface, wherein the outer surface of the eye is covered by the housing.

15. The device of claim 14, wherein the grounding bore is positioned beneath the eye and horizontally disposed within the housing.

16. A method of grounding and testing electrical equipment in a power distribution system comprising the steps of:
providing a fuse test and ground device, said device comprising:
an electrically insulated housing with a bore that extends from an aperture at a front of the housing towards a rear of the housing;
an electrical contact disposed at least partially within the bore;
a current interrupter electrically connected between the contact and a testing ground lead;
an electrically conductive connection disposed within the housing and coupled to the electrical contact and the current interrupter;
a grounding bore extending from a second aperture in the housing towards an interior of the housing and capable of receiving a ground connection, wherein the grounding bore provides a point of electrical connection to the electrical contact; and
an annunciator proximate to the current interrupter, wherein the annunciator provides an indication when a current flows through the current interrupter;
connecting the testing ground lead to ground;
mating the bore, the aperture, and the contact to a bushing;
determining if the annunciator indicates that current has flowed through the current interrupter; and
inserting a grounding plug into the grounding bore and connecting the plug to the point of electrical connection based on the annunciator indicating that a current is not flowing through the current interrupter.

17. The method of claim 16, wherein the grounding plug comprises:
a conductive shaft comprising a first end and a second end;
an operating eye coupled to the first end of the conductive shaft; and
a grounding cable having a first lead end and a second lead end; said first lead end of the grounding cable being electrically connected to the conductive shaft and said second lead end capable of being connected to ground.

18. The method of claim 17, further comprising the step of connecting the grounding cable to ground before the grounding plug is inserted into the grounding bore.

* * * * *